(12) United States Patent
Darveaux et al.

(10) Patent No.: US 8,653,674 B1
(45) Date of Patent: Feb. 18, 2014

(54) ELECTRONIC COMPONENT PACKAGE FABRICATION METHOD AND STRUCTURE

(75) Inventors: Robert Francis Darveaux, Gilbert, AZ (US); Brett Arnold Dunlap, Queen Creek, AZ (US); Ronald Patrick Huemoeller, Gilbert, AZ (US)

(73) Assignee: Amkor Technology, Inc.

( * ) Notice: Subject to any disclaimer, the term of this patent is extended or adjusted under 35 U.S.C. 154(b) by 112 days.

(21) Appl. No.: 13/233,606

(22) Filed: Sep. 15, 2011

(51) Int. Cl.
*H01L 23/52* (2006.01)

(52) U.S. Cl.
USPC .... 257/786; 257/738; 257/659; 257/E23.141; 257/E21.502

(58) Field of Classification Search
USPC ................ 257/678–733, 787–796, 257/E23.001–E23.194
See application file for complete search history.

(56) References Cited

U.S. PATENT DOCUMENTS

| | | |
|---|---|---|
| 3,868,724 A | 2/1975 | Perrino |
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |

(Continued)

FOREIGN PATENT DOCUMENTS

| | | |
|---|---|---|
| JP | 05-109975 | 4/1993 |
| JP | 05-136323 | 6/1993 |

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Mamadou Diallo
(74) *Attorney, Agent, or Firm* — McAndrews, Held & Malloy, Ltd.

(57) ABSTRACT

A redistribution pattern is formed on active surfaces of electronic components while still in wafer form. The redistribution pattern routes bond pads of the electronic components to redistribution pattern terminals on the active surfaces of the electronic components. The bond pads are routed to the redistribution pattern terminals while still in wafer form, which is a low cost and high throughput process, i.e., very efficient process.

20 Claims, 9 Drawing Sheets

(56) References Cited

U.S. PATENT DOCUMENTS

| | | |
|---|---|---|
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,898,219 A | 4/1999 | Barrow |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,489,676 B2 | 12/2002 | Taniguchi et al. |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,946,325 B2 | 9/2005 | Yean et al. |
| 6,953,995 B2 | 10/2005 | Farnworth et al. |
| 6,963,141 B2 | 11/2005 | Lee et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,087,514 B2 | 8/2006 | Shizuno |
| 7,125,744 B2 | 10/2006 | Takehara et al. |
| 7,185,426 B1 | 3/2007 | Hiner et al. |
| 7,189,593 B2 | 3/2007 | Lee |
| 7,198,980 B2 | 4/2007 | Jiang et al. |
| 7,242,081 B1 | 7/2007 | Lee |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,420,809 B2 | 9/2008 | Lim et al. |
| 7,429,786 B2 | 9/2008 | Karnezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,671,457 B1 | 3/2010 | Hiner et al. |
| 7,777,351 B1 | 8/2010 | Berry et al. |
| 7,825,520 B1 | 11/2010 | Longo et al. |
| 7,960,827 B1 | 6/2011 | Miller, Jr. et al. |
| 8,018,068 B1 | 9/2011 | Scanlan et al. |
| 8,026,587 B1 | 9/2011 | Hiner et al. |
| 8,110,909 B1 | 2/2012 | Hiner et al. |
| 8,203,203 B1 | 6/2012 | Scanlan |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0134450 A1 | 7/2003 | Lee |
| 2003/0141582 A1 | 7/2003 | Yang et al. |
| 2003/0197284 A1 | 10/2003 | Khiang et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2005/0046002 A1 | 3/2005 | Lee et al. |
| 2005/0139985 A1 | 6/2005 | Takahashi |
| 2005/0242425 A1 | 11/2005 | Leal et al. |
| 2006/0008944 A1 | 1/2006 | Shizuno |

(56) References Cited

U.S. PATENT DOCUMENTS

| | | | |
|---|---|---|---|
| 2006/0270108 | A1 | 11/2006 | Farnworth et al. |
| 2007/0273049 | A1 | 11/2007 | Khan et al. |
| 2007/0281471 | A1 | 12/2007 | Hurwitz et al. |
| 2007/0290376 | A1 | 12/2007 | Zhao et al. |
| 2008/0230887 | A1 | 9/2008 | Sun et al. |
| 2012/0013006 | A1* | 1/2012 | Chang et al. .......... 257/738 |
| 2012/0049375 | A1* | 3/2012 | Meyer et al. .......... 257/773 |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |

OTHER PUBLICATIONS

Kim et al., "Application of Through Mold Via (TMV) as PoP base package", 58*th* ECTC Proceedings, May 2008, Lake Buena Vista, FL, 6 pages, IEEE.

Scanlan, "Package-on-package (PoP) with Through-mold Vias", *Advanced Packaging*, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Huemoeller et al., "Build Up Motherboard Fabrication Method and Structure", U.S. Appl. No. 11/824,395, filed Jun. 29, 2007.

Huemoeller et al., "Buildup Dielectric Layer Having Metallization Pattern Semiconductor Package Fabrication Method", U.S. Appl. No. 12/387,691, filed May 5, 2009.

Scanlan et al., "Semiconductor Package Including a Top-Surface Metal Layer for Implementing Circuit Features", U.S. Appl. No. 12/802,715, filed Jun. 10, 2010.

Jung et al., "Wafer Level Fan Out Semiconductor Device and Manufacturing Method Thereof", U.S. Appl. No. 12/939,588, filed Nov. 4, 2010.

\* cited by examiner

Electronic component package fabrication method 100

ELECTRONIC COMPONENT PACKAGE FABRICATION METHOD AND STRUCTURE

TECHNICAL FIELD

The present application relates to the field of electronics, and more particularly, to methods of forming electronic component packages and related structures.

BACKGROUND

The pattern of bond pads on the active surface of an electronic component are typically redistributed to a pattern of terminals for electrical connection to other structures. This redistribution requires formation of several circuit patterns one on top of another. The circuit patterns are electrically isolated from one another by dielectric layers and are electrically interconnected by vias extending through the dielectric layers.

Each circuit pattern and associated dielectric layer requires several manufacturing operations and thus adds to the overall cost of the resulting electronic component package. Accordingly, it is desirable to minimize the number of circuit patterns while providing the desired redistribution.

BRIEF DESCRIPTION OF THE DRAWINGS

In the following description, the same or similar elements are labeled with the same or similar reference numbers.

DETAILED DESCRIPTION

Figure 2:
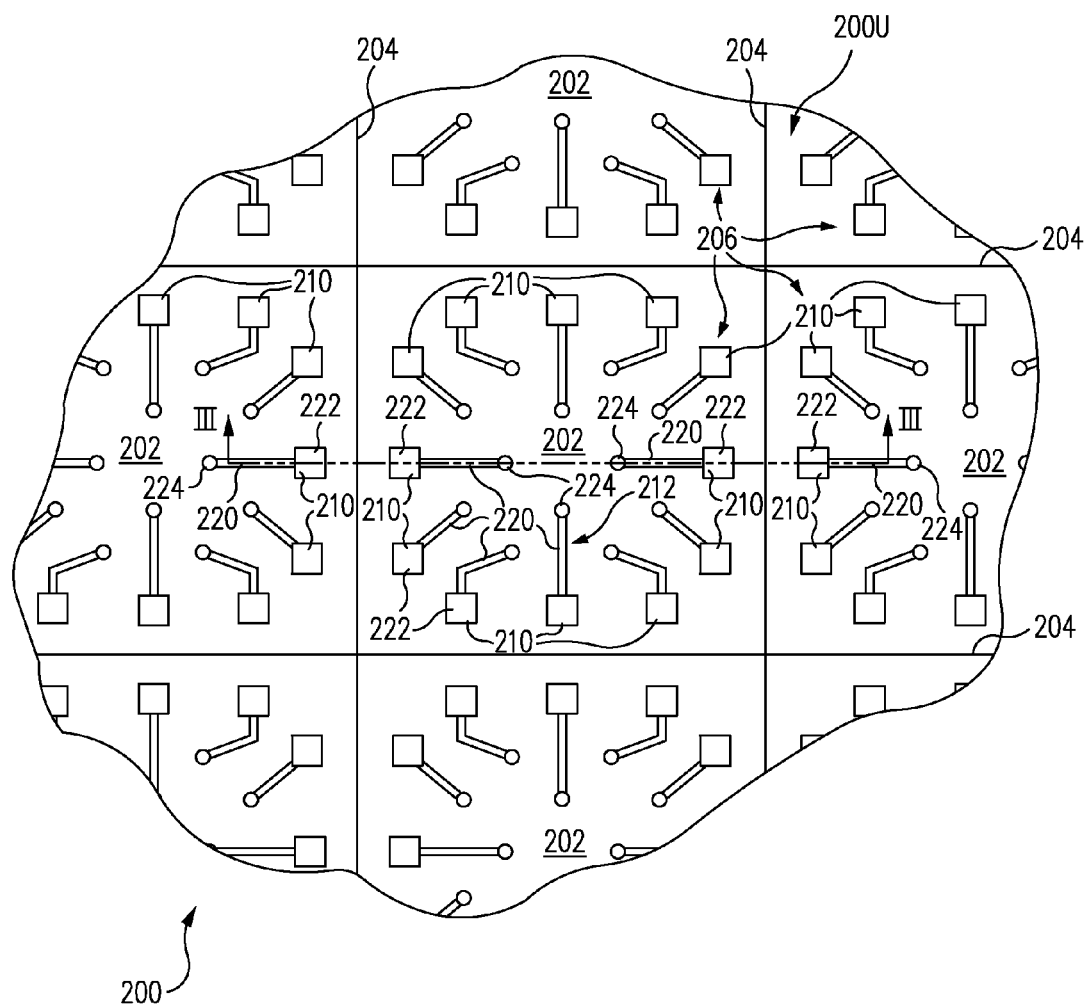
FIG. 2 is a top plan view of a wafer prior to singulation in accordance with one embodiment.
Figure 3:
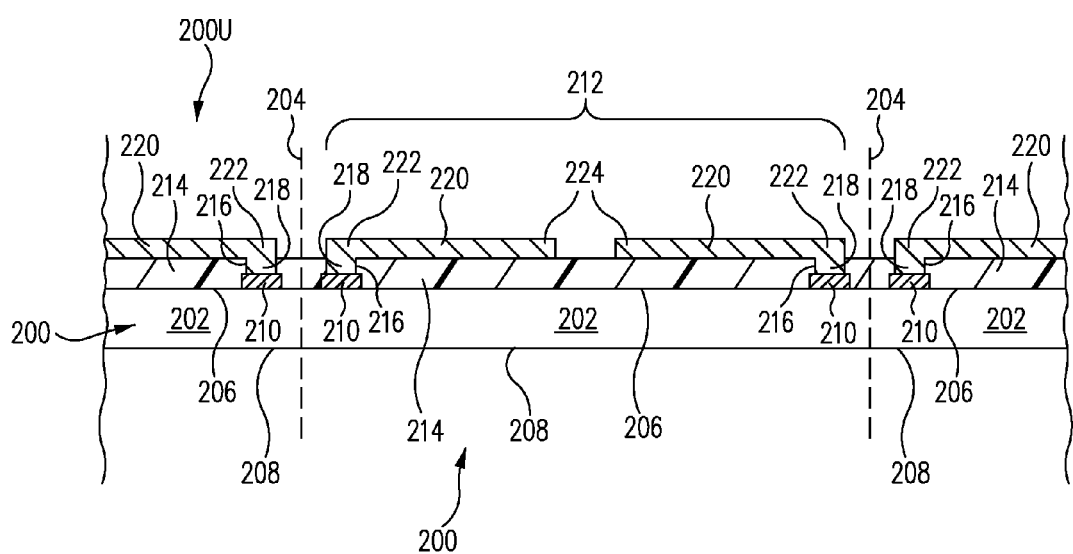
FIG. 3 is a cross-sectional view of the wafer along the line III-III of FIG. 2 in accordance with one embodiment.

As an overview and in accordance with one embodiment, referring to FIGS. 2, and 3 together, a redistribution pattern 212 is formed on active surfaces 206 of electronic components 202 while still in wafer form. Redistribution pattern 212 redistributes the pattern of bond pads 210 of electronic components 202 to the pattern of redistribution pattern terminals 224 of redistribution pattern 212.

Of note, the pattern of bond pads 210 is routed to the pattern of redistribution pattern terminals 224 on active surfaces 206 of electronic components 202 while still in wafer form, which is a low cost and high throughput process, i.e., very efficient process.

Figure 9:
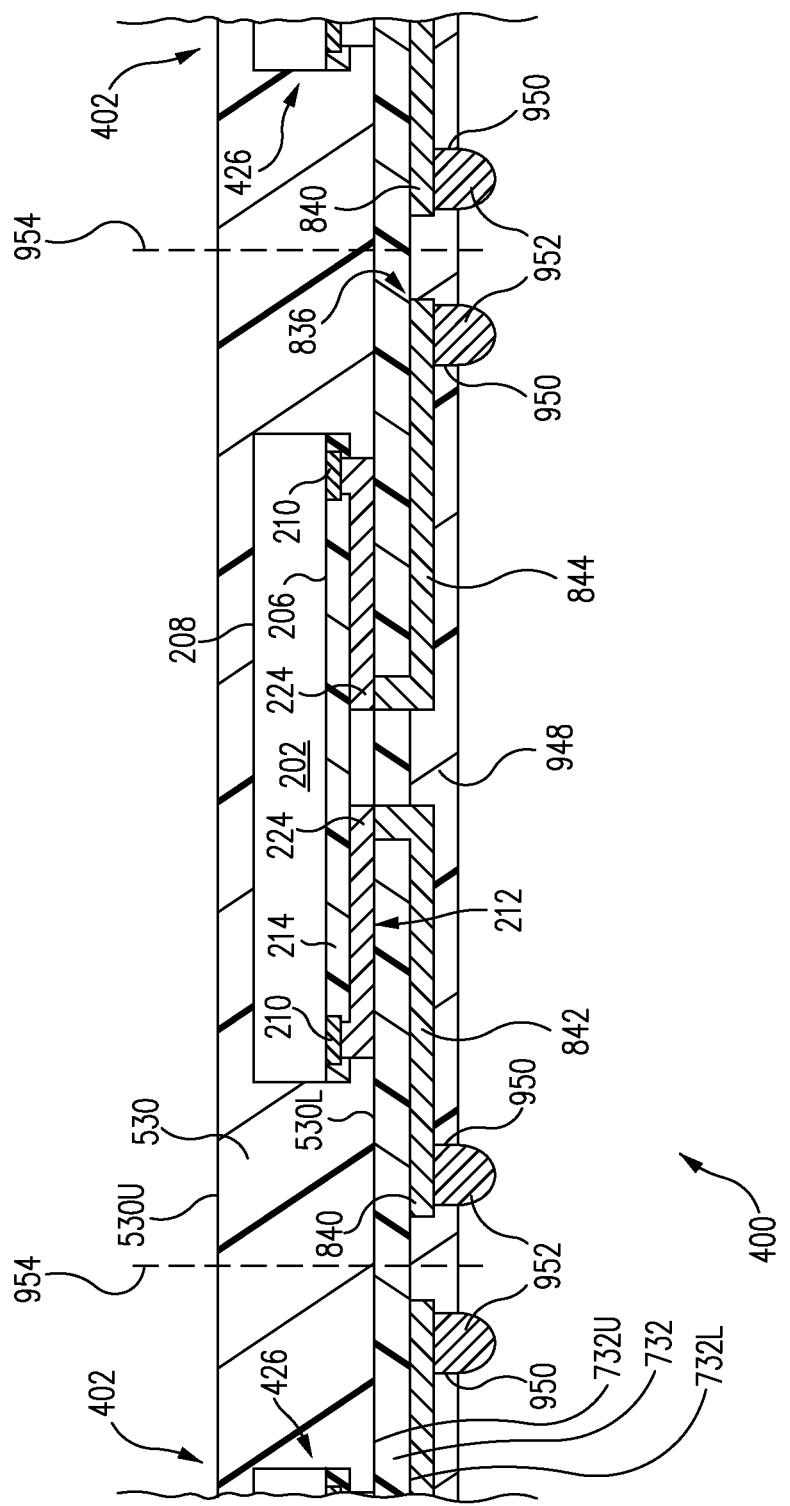

Referring now to FIG. 9, after singulation, electronic components 202 and redistribution patterns 212 are overmolded in a package body 530 to form an array 400. A buildup dielectric layer 732 and buildup circuit patterns 836 are formed.

Buildup circuit patterns 836 redistribute the pattern of redistribution pattern terminals 224 of redistribution pattern 212 to the pattern of lands 840. By using redistribution pattern 212 and buildup circuit pattern 836, two layers of routing are achieved. More particularly, the existing area of active surfaces 206 of electronic components 202 is used to form routing, i.e., redistribution pattern 212, instead of performing routing on the reconstituted wafer, i.e., in array 400.

In this manner, only a single layer of routing, i.e., buildup circuit pattern 836, is formed on the reconstituted wafer thus simplifying manufacturing and reducing costs as compared to forming two or more layers of routing on the reconstituted wafer. Further, routing on active surfaces 206 of electronic components 202 minimizes costs by leveraging efficiencies of processing prior to singulation of electronic components 202 from wafer 200.

Figure 1:
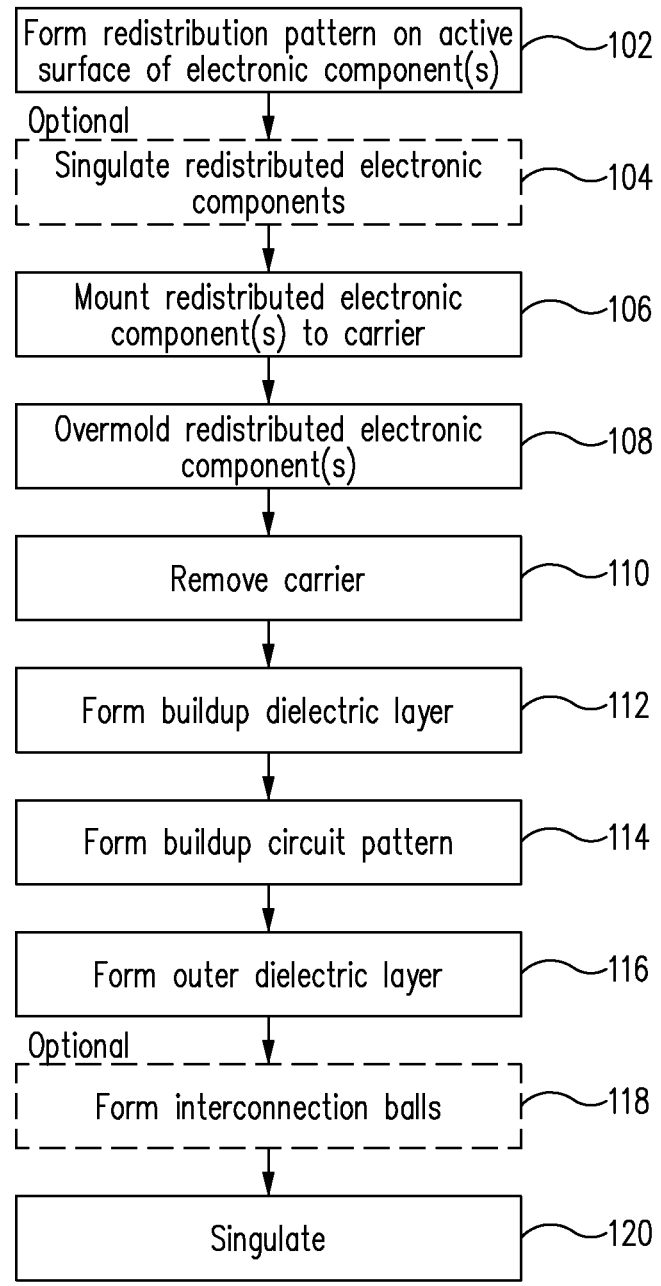
FIG. 1 is a block diagram of an electronic component package fabrication method in accordance with one embodiment.

Now in more detail, FIG. 1 is a block diagram of an electronic component package fabrication method 100 in accordance with one embodiment. FIG. 2 is a top plan view of a wafer 200 prior to singulation in accordance with one embodiment. FIG. 3 is a cross-sectional view of wafer 200 along the line III-III of FIG. 2 in accordance with one embodiment.

Referring now to FIGS. 1, 2, and 3 together, wafer 200, sometimes called a substrate, e.g., a silicon wafer, includes a plurality of electronic components 202 integrally connected together. Electronic components 202 are delineated from one another by singulation streets 204.

In one embodiment, electronic components 202 are integrated circuit chips, e.g., active components. However, in other embodiments, electronic components 202 are passive components such as capacitors, resistors, or inductors.

In accordance with this embodiment, electronic components 202 include active surfaces 206 and opposite inactive surfaces 208. Electronic components 202 further include bond pads 210 formed on active surfaces 206.

Bond pads 210 form the input/output (I/O) terminals for electronic components 202. Bond pads 210 are the finished and outermost I/O terminals for electronic components 202 in their final form as would be provided from the manufacturer of electronic components 202. Stated another way, bond pads 210 are the I/O terminals of wafer 200 as finished from the wafer manufacturer.

In accordance with this embodiment, bond pads 210 are distributed in an edge array. More particularly, bond pads 210 are distributed upon active surfaces 206 adjacent singulation streets 204. Although an edge array is illustrated in FIGS. 2, 3, in other embodiments, bond pads 210 are distributed in an area array, i.e., are distributed in an array throughout active surfaces 206 including the central regions of active surfaces 206.

In form redistribution pattern on active surface of electronic component(s) operation 102, a redistribution pattern 212 is formed on active surfaces 206 of electronic components 202.

In one embodiment, to form redistribution pattern 212, a redistribution pattern dielectric layer 214 is applied to active surfaces 206 of electronic components 202 and more generally to an upper, e.g., first, surface 200U of wafer 200. Redistribution pattern dielectric layer 214 is then patterned to form via apertures 216 therein. Each via apertures 216 extends entirely through redistribution pattern dielectric layer 214 to a respective bond pad 210. Accordingly, bond pads 210 are exposed through via apertures 216.

Redistribution pattern 212 is then formed. Illustratively, an electrically conductive material, e.g. copper, is formed on redistribution pattern dielectric layer 214 and fills via apertures 216. For example, the electrically conductive material is blanket deposited, e.g., plated, upon redistribution pattern dielectric layer 214 and within via apertures 216. The electrically conductive material is then patterned, e.g., selectively etched, to form redistribution pattern 212.

In another embodiment, an electrically conductive material is selectively applied to form redistribution pattern 212. For example, a mask is formed upon redistribution pattern dielectric layer 214 and patterned to form a positive image of redistribution pattern 212. The pattern within the mask is filled with an electrically conductive material, e.g., by plating, to form redistribution pattern 212. The mask is then removed.

Redistribution pattern dielectric layer 214 electrically isolates redistribution pattern 212 from active surface 206. Illustratively, redistribution pattern dielectric layer 214 is formed of PolyBenzOxazole (PBO), Poly-Butadiene Resin (PBR), or other dielectric material.

In one embodiment, active surface 206 includes a dielectric material, e.g., a passivation layer, thereon as wafer 200 is finished from the wafer manufacturer. In accordance with this embodiment, formation of redistribution pattern dielectric layer 214 is optional, and in one embodiment, redistribution pattern dielectric layer 214 is not formed.

Redistribution pattern 212 includes electrically conductive vias 218 within via apertures 216 and electrically connected to bond pads 210.

Redistribution pattern 212 further includes traces 220, i.e., long thin electrical conductors having a length much greater than a width.

Each trace 220 is electrically connected to a respective via 218 and thus a respective bond pad 210 at first ends 222 of traces 220. In accordance with this embodiment, each trace 220 terminates (ends) in a redistribution pattern terminal 224. Accordingly, the pattern of bond pads 210 is redistributed to the pattern of redistribution pattern terminals 224 by redistribution pattern 212.

Of note, the pattern of bond pads 210 is routed to the pattern of redistribution pattern terminals 224 on active surfaces 206 of electronic components 202 while still in wafer form, which is a low cost and high throughput process, i.e., very efficient process.

From form redistribution pattern on active surface of electronic component(s) operation 102, flow moves, optionally, to a singulate redistributed electronic components operation 104. In singulate redistributed electronic components operation 104, electronic components 202 are singulated, i.e., wafer 200 is cut along singulation streets 204. This forms a plurality of individual electronic components 202 each having a redistribution pattern 212 formed on active surfaces 206. Electronic components 202 are singulated by mechanical sawing, laser, or other singulation technique.

Although formation of redistribution patterns 212 on electronic components 202 while still in wafer form, i.e., while electronic components 202 are integrally connected together within wafer 200, is described above and illustrated, in another embodiment, a redistribution pattern 212 is formed upon an individual (singulated) electronic component 202 in a manner similar to that described above. Accordingly, singulate redistributed electronic components operation 104 is an optional operation.

A singulated electronic component 202 having a redistribution pattern 212 formed thereon is sometimes called a redistributed electronic component. Further packaging of redistributed electronic components is illustrated in FIG. 4 and discussed further below.

Figure 4:
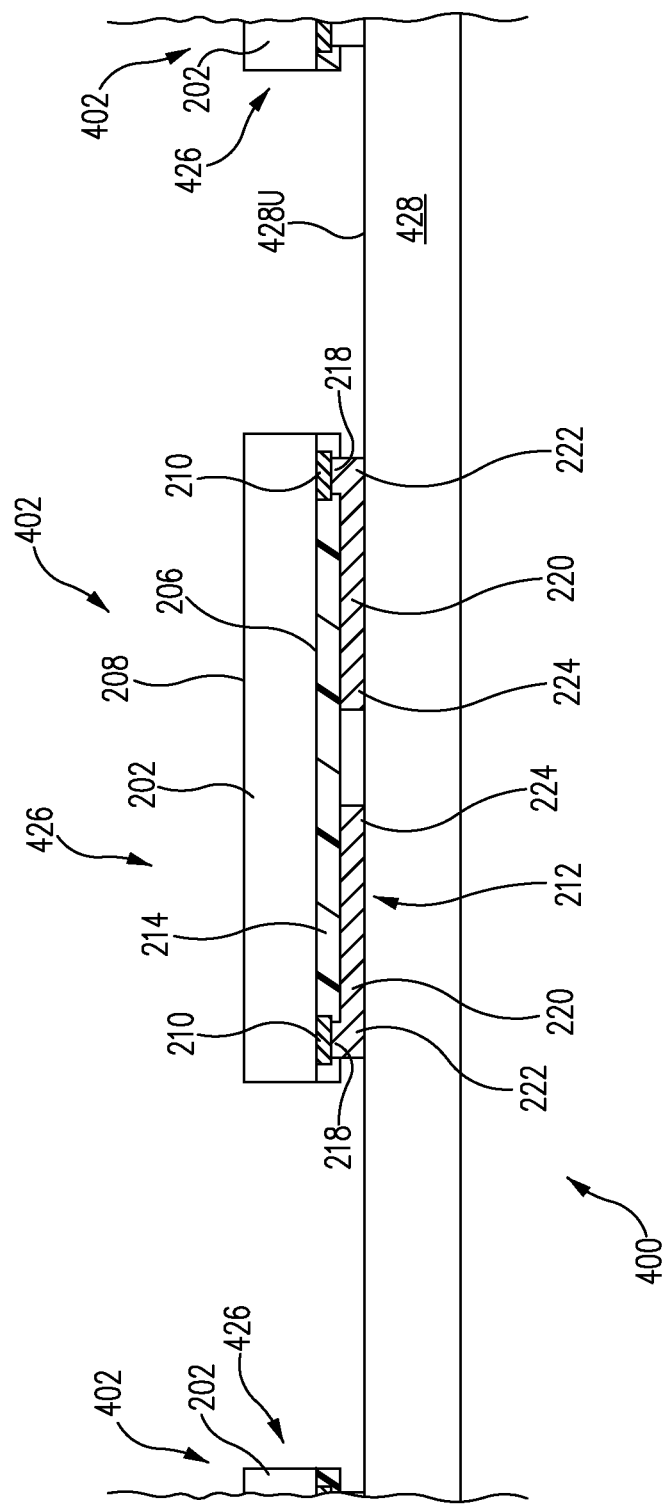
FIG. 4 is a cross-sectional view of an array of electronic component packages during fabrication in accordance with one embodiment.

FIG. 4 is a cross-sectional view of an array 400 of electronic component packages 402 during fabrication in accordance with one embodiment. Array 400 is formed with redistributed electronic components 426. Redistributed electronic components 426 include electronic components 202 having redistribution patterns 212 formed thereon as described above.

Referring now to FIGS. 1 and 4 together, from singulate redistributed electronic components operation 104 (or directly from form redistribution pattern on active surface of electronic component(s) operation 102 in the event that singulate redistributed electronic components operation 104 is not performed), flow moves to a mount redistributed electronic component(s) to carrier operation 106. In mount redistributed electronic component(s) to carrier operation 106, redistributed electronic components 426 are mounted to a carrier 428.

To mount redistributed electronic components 426, redistribution patterns 212, and more generally, active surfaces 206, are pressed into carrier 428. Carrier 428 is sticky, i.e., includes an adhesive upper surface 428U, and thus redistributed electronic components 426 adhere to carrier 428.

In one embodiment, redistributed electronic components 426 are mounted as an array or strip to carrier 428. Illustratively, redistributed electronic components 426 are mounted in a 2×2, a 3×3, . . . , or an n×m array or in a strip, i.e., a 1×n array. The spacing between redistributed electronic components 426 is sufficient to provide the proper fan-out redistribution to be performed at later stages during fabrication as discussed in detail below.

In yet another embodiment, a single redistributed electronic component 426 is mounted to carrier 428 and processed individually.

Figure 5:
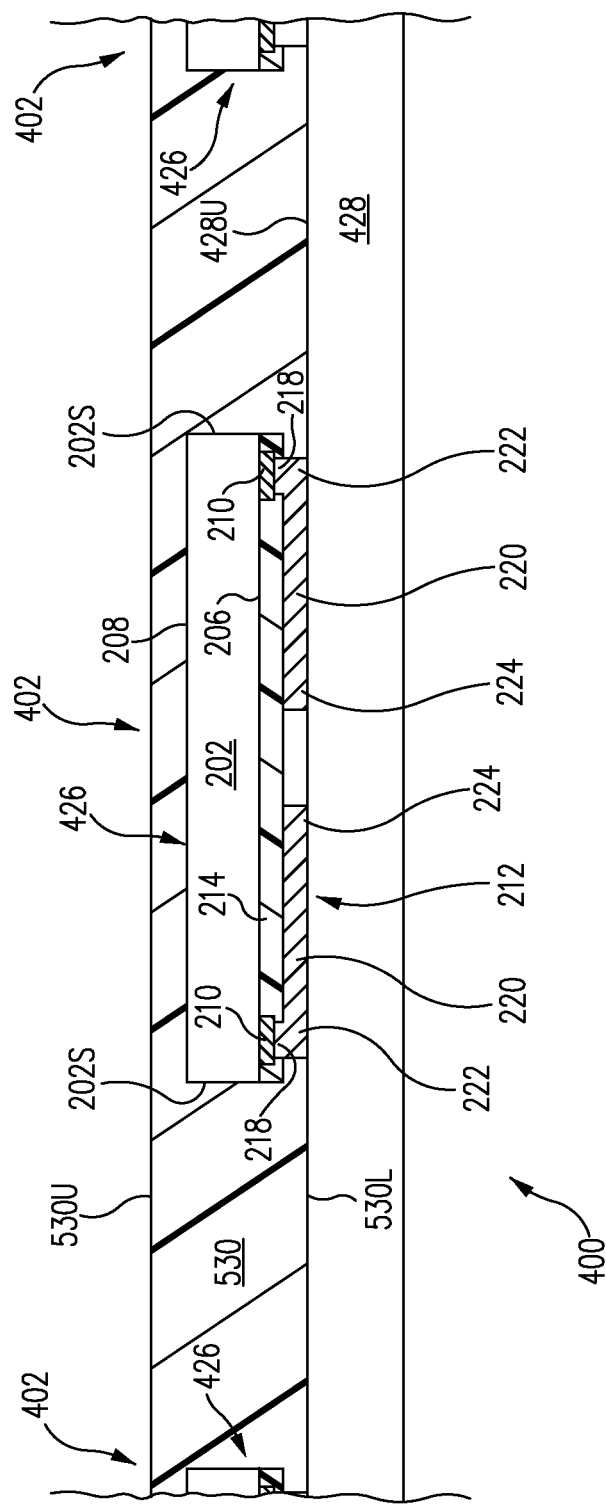
FIGS. 5, 6, 7, 8, and 9 are cross-sectional views of the array of FIG. 4 at further stages during fabrication in accordance with various embodiments.

FIG. 5 is a cross-sectional view of array 400 of FIG. 4 at a further stage during fabrication in accordance with one embodiment. Referring now to FIGS. 1 and 5 together, from mount redistributed electronic component(s) to carrier operation 106, flow moves to an overmold redistributed electronic component(s) operation 108. In overmold redistributed electronic component(s) operation 108, redistributed electronic components 426 are overmolded, sometimes called encapsulated, encased, or surrounded, in a dielectric package body 530.

Illustratively, redistributed electronic components 426 and carrier 428 are placed into a mold and mold compound is injected into the mold and around redistributed electronic components 426. This mold compound hardens to form package body 530. Thus, in accordance with this embodiment, package body 530 is formed of mold compound. However, in other embodiments, package body 530 is formed of other dielectric materials such as hardened liquid encapsulant.

Package body 530 includes a lower, e.g., first, surface 530L attached to upper surface 428U of carrier 428 and an upper, e.g., second, surface 530U. Package body 530 completely encloses and directly contacts redistributed electronic components 426 including inactive surface 208 and sides 202S of electronic components 202 and the exposed portion of upper surface 428U of carrier 428. Lower surface 530L is parallel to and coplanar with redistribution patterns 212.

Figure 6:
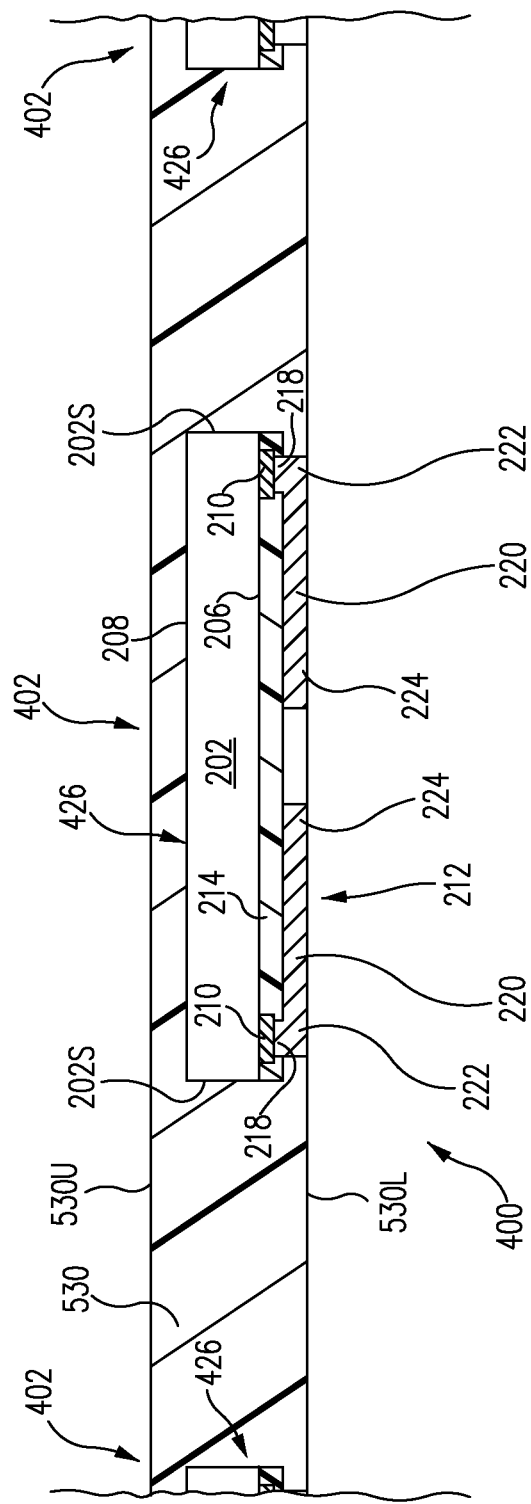

FIG. 6 is a cross-sectional view of array 400 of FIG. 5 at a further stage during fabrication in accordance with one embodiment. Referring now to FIGS. 1 and 6 together, from overmold redistributed electronic component(s) operation 108, flow moves to a remove carrier operation 110. In remove carrier operation 110, carrier 428 (see FIG. 5) is removed as illustrated in FIG. 6. Package body 530 is a relatively rigid material providing support to array 400 thus allowing carrier 428 to be removed.

In various embodiments, carrier 428 is removed by peeling, etching, grinding, or other removal technique. Removal of carrier 428 exposes redistribution patterns 212. After removal of carrier 428, array 400 is sometimes called a reconstituted wafer.

Figure 7:
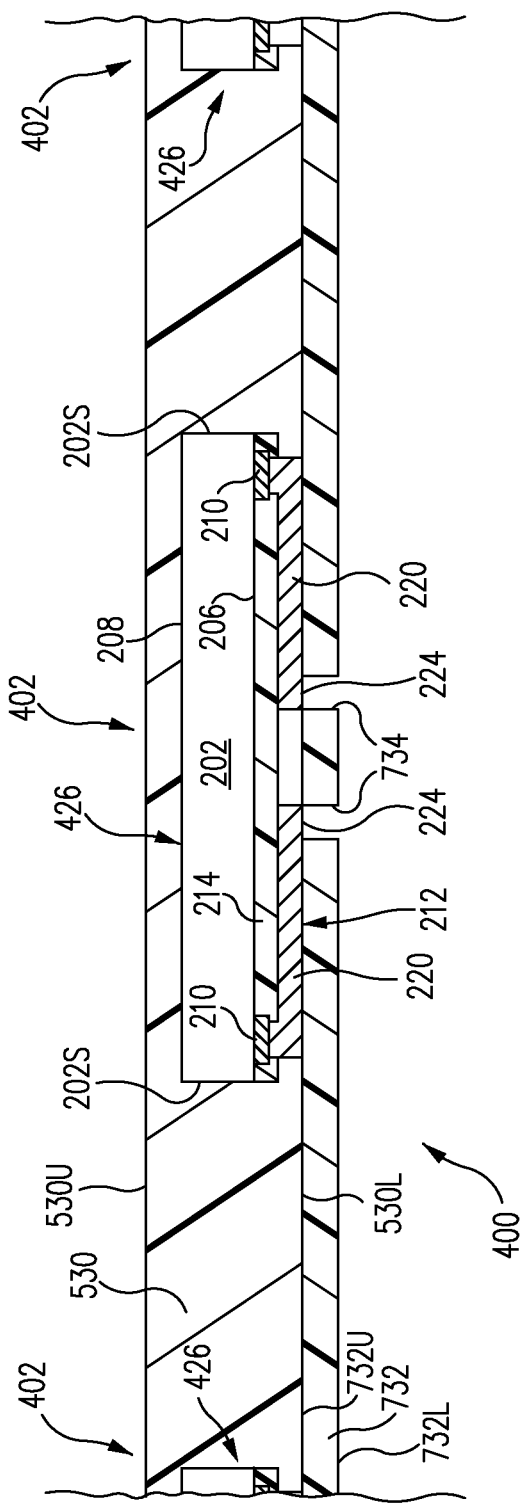

FIG. 7 is a cross-sectional view of array 400 of FIG. 6 at a further stage during fabrication in accordance with one embodiment. Referring now to FIGS. 1 and 7 together, from remove carrier operation 110, flow moves to a form buildup dielectric layer operation 112. In form buildup dielectric layer operation 112, a buildup dielectric layer 732 is applied to lower surface 530L of package body 530 and redistribution pattern 212 including redistribution pattern terminals 224.

More particularly, an upper, e.g., first, surface 732U of buildup dielectric layer 732 is applied to lower surface 530L of package body 530 and redistribution pattern 212. Buildup dielectric layer 732 further includes a lower, e.g., second, surface 732L. Buildup dielectric layer 732 is a dielectric material, e.g., polyimide, although is formed of other dielectric materials in other embodiments.

Further, in form buildup dielectric layer operation 112, buildup dielectric layer 732 is patterned to form redistribution pattern terminal apertures 734 in buildup dielectric layer 732. Illustratively, redistribution pattern terminal apertures 734 are formed using laser ablation, etching, or other aperture formation technique.

Redistribution pattern terminal apertures 734 are formed entirely through buildup dielectric layer 732. Redistribution pattern terminal apertures 734 extend through buildup dielectric layer 732 and to redistribution pattern terminals 224. Redistribution pattern terminals 224 are exposed through redistribution pattern terminal apertures 734.

Although formation of redistribution pattern terminal apertures 734 after application of buildup dielectric layer 732 is discussed above, in another embodiment, buildup dielectric layer 732 is formed with redistribution pattern terminal apertures 734 and then applied to lower surface 530L of package body 530 and redistribution pattern 212.

Figure 8:
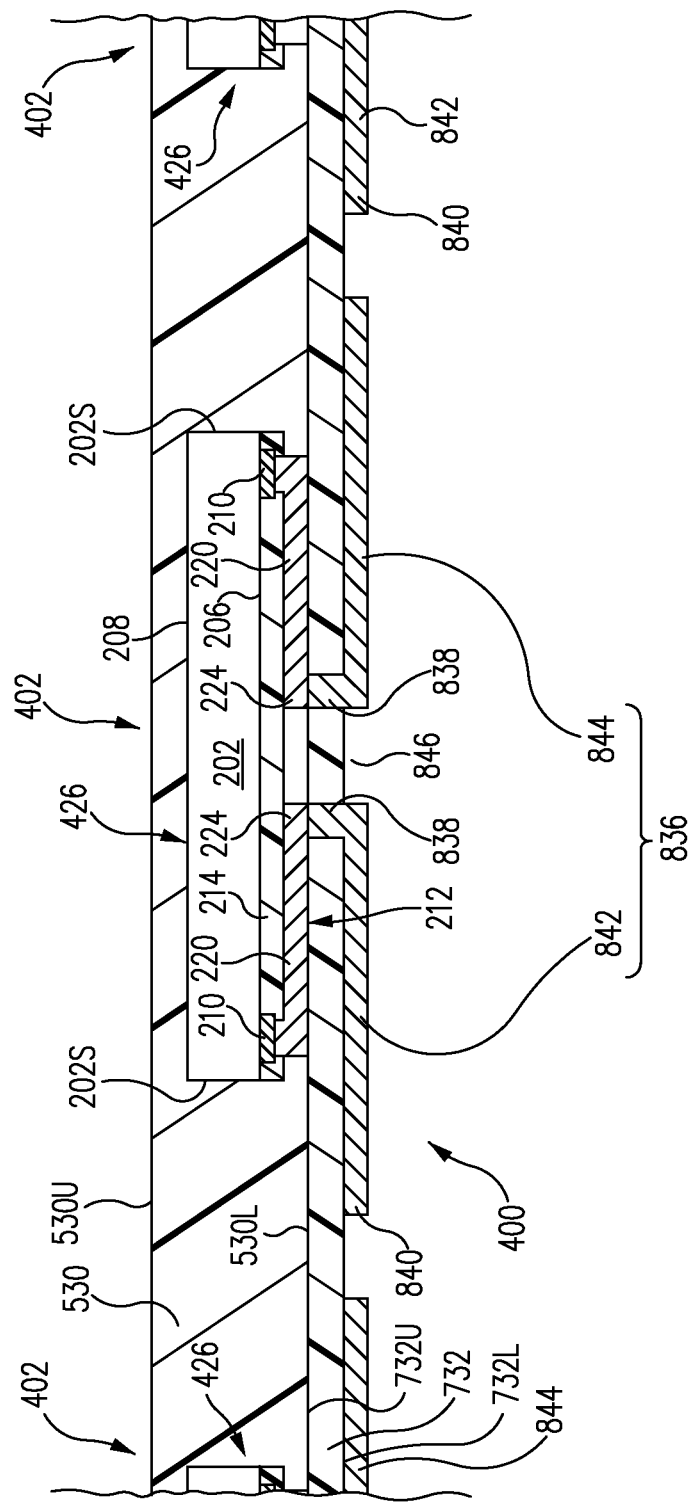

FIG. 8 is a cross-sectional view of array 400 of FIG. 7 at a further stage during fabrication in accordance with one embodiment. Referring now to FIGS. 1, 7, and 8 together, from form buildup dielectric layer operation 112, flow moves to a form buildup circuit pattern operation 114. In form buildup circuit pattern operation 114, an electrically conductive buildup circuit pattern 836 is formed. Buildup circuit pattern 836 is sometimes called a redistribution layer (RDL).

Buildup circuit pattern 836 includes electrically conductive redistribution pattern terminal vias 838 formed within redistribution pattern terminal apertures 734. Redistribution pattern terminal vias 838 are electrically connected to redistribution pattern terminals 224 of redistribution pattern 212.

Buildup circuit pattern 836 further includes electrically conductive lands 840 and electrically conductive traces 842. In accordance with this embodiment, lands 840 and traces 842 are formed on lower surface 732L of buildup dielectric layer 732. Traces 842 electrically connect redistribution pattern terminal vias 838 with lands 840.

Traces 842 have a length much greater than a width. Generally, traces 842 are long conductors that electrically connect redistribution pattern terminal vias 838 to lands 840. Stated another way, traces 842 redistribute, e.g., fan-out or fan-in, the pattern of redistribution pattern terminal vias 838, i.e., the pattern of redistribution pattern terminals 224 of redistribution pattern 212, to the pattern of lands 840. In accordance with this embodiment, traces 842 extend laterally outwards beyond sides 202S of electronic components 202 in a fan-out configuration.

By using redistribution pattern 212 and buildup circuit pattern 836, two layers of routing are achieved. More particularly, the existing area of active surfaces 206 of electronic components 202 is used to form routing, i.e., redistribution pattern 212, instead of performing routing on the reconstituted wafer, i.e., array 400. In this manner, only a single layer of routing, i.e., buildup circuit pattern 836, is formed on the reconstituted wafer thus simplifying manufacturing and reducing costs as compared to forming two or more layers of routing on the reconstituted wafer. Further, routing on active surfaces 206 of electronic components 202 minimizes costs by leveraging efficiencies of processing prior to singulation of electronic components 202 from wafer 200.

In accordance with this embodiment, buildup circuit pattern 836 further includes an electrically conductive plane 844, e.g., a ground or power plane, hereinafter referred to as a ground/power plane 844. Ground/power plane 844 is a general planar field, or fields, of electrically conductive material as contrasted to long thin traces 842.

For example, ground/power plane 844 is formed on the area of lower surface 732L of buildup dielectric layer 732 not occupied by traces 842. Of course, ground/power plane 844 is electrically isolated from traces 842 such that a small gap 846 exists between traces 842 and ground/power plane 844.

Ground/power plane 844 is electrically connected to one or more of redistribution pattern terminal vias 838 and thus to the respective bond pads 210 by way of the respective traces 220 of redistribution pattern 212. In one embodiment, a reference voltage source, e.g., ground or power, is provided to ground/power plane 844 and thus to the respective bond pads 210 electrically connected therewith.

Although ground/power plane 844 is illustrated and discussed above, in another embodiment, buildup circuit pattern 836 is formed without ground/power plane 844. Accordingly, ground/power plane 844 is optional and, in one embodiment, buildup circuit pattern 836 is formed without ground/power plane 844.

In one embodiment, buildup circuit pattern 836 is formed by plating an electrically conductive material such as copper. In one embodiment, a resist is applied to buildup dielectric layer 732 and patterned to form a circuit pattern artifact therein, e.g., a positive image of buildup circuit pattern 836. The circuit pattern artifact formed within the resist is filled with the electrically conductive material to form buildup circuit pattern 836. The resist is then removed.

In another embodiment, an electrically conductive material is plated to cover buildup dielectric layer 732. The electrically conductive material on buildup dielectric layer 732 is then selectively etched to form buildup circuit pattern 836.

As set forth above, buildup circuit pattern 836, e.g., lands 840, traces 842, and optionally power/ground plane 844 thereof, is formed on lower surface 732L of buildup dielectric layer 732. However, in another embodiment, buildup circuit pattern 836 is embedded into buildup dielectric layer 732 at lower surface 732L.

In accordance with this embodiment, a circuit pattern artifact, e.g., a positive image of buildup circuit pattern 836, is formed in buildup dielectric layer 732 at lower surface 732L. The circuit pattern artifact is formed using laser ablation, for example.

The circuit pattern artifact formed within buildup dielectric layer 732 is filled with the electrically conductive material to form buildup circuit pattern 836. Buildup circuit pattern 836 is embedded within buildup dielectric layer 732.

FIG. 9 is a cross-sectional view of array 400 of FIG. 8 at a further stage during fabrication in accordance with one embodiment. Referring now to FIGS. 1 and 9 together, from form buildup circuit pattern operation 114, flow moves to a form outer dielectric layer operation 116. In form outer dielectric layer operation 116, an outer dielectric layer 948, e.g., solder mask, is formed.

More particularly, outer dielectric layer 948 is applied to lower surface 732L of buildup dielectric layer 732 and buildup circuit pattern 836. Outer dielectric layer 948 is patterned to form land apertures 950 in outer dielectric layer 948. Land apertures 950 expose lands 840 of buildup circuit pattern 836. If ground/power plane 844 is formed, land apertures 950 expose one or more areas of ground/power plane 844.

From form outer dielectric layer operation 116, flow moves, optionally, to a form interconnection balls operation 118. In form interconnection balls operation 118, interconnection balls 952, e.g., solder, are formed on lands 840 and in land apertures 950 of outer dielectric layer 948. Further, if ground/power plane 844 is formed, interconnection balls 952 are formed on the exposed areas of ground/power plane 844 and in land apertures 950 of outer dielectric layer 948.

Interconnection balls 952 are distributed in a Ball Grid Array (BGA) in one embodiment. Interconnection balls 952 are reflowed, i.e., heated to a melt and re-solidified, to mount electronic component packages 402 to another structure such as a printed circuit motherboard.

The formation of interconnection balls 952 is optional. In one embodiment, interconnection balls 952 are not formed and so form interconnection balls operation 118 is an optional operation.

From form interconnection balls operation 118 (or directly from form outer dielectric layer operation 116 in the event that form interconnection balls operation 118 is not performed), flow moves to a singulate operation 120. In singulate operation 120, array 400 is singulated, e.g., by sawing along singulation streets 954. More particularly, package body 530, buildup dielectric layer 732, and outer dielectric layer 948 are cut along singulation streets 954 to singulate electronic component packages 402 from one another.

As set forth above, a plurality of electronic component packages 402 are formed simultaneously in array 400 using the methods as described above. Array 400 is singulated to singulate the individual electronic component packages 402 from one another in singulate operation 120.

Although formation of array 400 of electronic component packages 402 is described above, in other embodiments, electronic component packages 402 are formed individually using the methods as described above.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A method comprising:
coupling a redistribution pattern to an active surface of an electronic component to form a distributed electronic component, the entire redistribution pattern being coupled to the active surface;
coupling the redistributed electronic component to a carrier; and
overmolding the redistributed electronic component.

2. The method of claim 1 further comprising:
removing the carrier.

3. The method of claim 2 further comprising:
coupling a buildup dielectric layer to the redistribution pattern, the buildup dielectric layer comprising redistribution pattern terminal apertures exposing redistribution pattern terminals of the redistribution pattern.

4. The method of claim 3 further comprising:
coupling a buildup circuit pattern to the buildup dielectric layer, the buildup circuit pattern being coupled to the redistribution pattern terminals through the redistribution pattern terminal apertures.

5. The method of claim 4 further comprising:
coupling an outer dielectric layer to the buildup circuit pattern.

6. The method of claim 5 further comprising:
coupling interconnection balls to the buildup circuit pattern through land apertures of the outer dielectric layer.

7. The method of claim 1 wherein the active surface comprises bond pads, wherein the coupling a redistribution pattern to an active surface of an electronic component comprises:
coupling the redistribution pattern to the bond pads.

8. The method of claim 7 wherein the coupling a redistribution pattern to an active surface of an electronic component further comprises:
coupling a redistribution pattern dielectric layer to the active surface, the redistribution pattern dielectric layer comprising via apertures exposing the bond pads; and
coupling the redistribution pattern to the redistribution pattern dielectric layer, the redistribution pattern being coupled to the bond pads through the via apertures.

9. The method of claim 4 wherein the buildup circuit pattern comprises traces comprising lands.

10. The method of claim 9 wherein the buildup circuit pattern further comprises an electrically conductive plane.

11. A method comprising:
providing a wafer comprising a plurality of electronic component integrally connected together, the electronic components comprising active surfaces comprising bond pads;
forming redistribution patterns on the active surfaces to form redistributed electronic components integrally connected in the wafer, the redistribution patterns redistributing the pattern of the bond pads to a pattern of redistribution pattern terminals of the redistribution patterns;
singulating the redistributed electronic components;
mounting the redistributed electronic components to a carrier; and
overmolding the redistributed electronic components in a package body.

12. The method of claim 11 further comprising:
removing the carrier, wherein the package body supports an array comprising the redistributed electronic components and the package body.

13. The method of claim 12 further comprising:
coupling a buildup dielectric layer to a first surface of the package body and the redistribution patterns; and
forming redistribution pattern terminal apertures through the buildup dielectric layer to expose the redistribution pattern terminals.

14. The method of claim 13 further comprising:
forming buildup circuit patterns coupled to the redistribution pattern terminals through the redistribution pattern terminal apertures, the buildup circuit patterns redistributing the pattern of the redistribution pattern terminals to a pattern of lands of the buildup circuit patterns.

15. The method of claim 14 further comprising singulating the array to form a plurality of electronic component packages.

16. A method comprising:
providing an electronic component comprising an active surface comprising bond pads thereon;

coupling a redistribution pattern to the active surface and the bond pads, the entire redistribution pattern being coupled to the active surface;

coupling a buildup dielectric layer to the redistribution pattern; and coupling a buildup circuit pattern to the buildup dielectric layer, the buildup circuit pattern being coupled to redistribution pattern terminals of the redistribution pattern through redistribution pattern terminal apertures of the buildup dielectric layer.

17. The method of claim 16 further comprising:

enclosing an inactive surface and sides of the electronic component in a package body.

18. The method of claim 17 wherein the package body comprises a first surface parallel to and coplanar with the redistribution pattern.

19. The method of claim 18 wherein the buildup dielectric layer is coupled to the first surface of the package body, the buildup circuit pattern comprising traces extending laterally outwards beyond the sides of the electronic component in a fan out-configuration.

20. The method of claim 19 wherein the buildup circuit pattern further comprises an electrically conductive plane.

\* \* \* \* \*